(12) United States Patent
Makita et al.

(10) Patent No.: US 6,833,590 B2
(45) Date of Patent: Dec. 21, 2004

(54) SEMICONDUCTOR DEVICE (75) Inventors: Chikao Makita, Tokyo (JP); Kunihiko Karasawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 89 days.

(21) Appl. No.: 10/378,085

(22) Filed: Mar. 4, 2003

(65) Prior Publication Data

US 2003/0230781 A1 Dec. 18, 2003

Related U.S. Application Data (63) Continuation-in-part of application No. 09/871,977, filed on Jun. 4, 2001, now Pat. No. 6,583,475.

(30) Foreign Application Priority Data

Jan. 11, 2001 (JP) .......................................... 2001-003501

(51) Int. Cl.[7] .......................... H01L 23/62; H01L 29/74; H01L 31/111; H01L 29/00
(52) U.S. Cl. ........................ 257/355; 257/173; 257/356; 257/357; 257/358; 257/359; 257/360; 257/361; 257/362; 257/363; 257/546
(58) Field of Search .......................... 257/173, 355–363, 257/546

(56) References Cited

U.S. PATENT DOCUMENTS

| 4,476,479 | A |   | 10/1984 | Saito |
| 5,006,949 | A |   | 4/1991  | Guajardo |
| 5,304,802 | A | * | 4/1994  | Kumagai ..................... 257/328 |
| 5,466,952 | A | * | 11/1995 | Moody ........................ 257/139 |
| 5,504,348 | A |   | 4/1996  | Yoshida et al. |
| 5,530,271 | A | * | 6/1996  | Fallica ........................ 257/173 |
| 5,534,814 | A |   | 7/1996  | Archer |
| 5,686,751 | A |   | 11/1997 | Wu |
| 5,691,557 | A |   | 11/1997 | Watanabe |
| 5,719,420 | A | * | 2/1998  | Kohno et al. ................ 257/328 |
| 5,825,067 | A |   | 10/1998 | Takeuchi et al. |
| 5,910,675 | A |   | 6/1999  | Horiguchi et al. |
| 5,949,090 | A |   | 9/1999  | Iwasa et al. |
| 6,051,984 | A |   | 4/2000  | Huang et al. |

FOREIGN PATENT DOCUMENTS

| JP | 3-76264   | 4/1991 |
| JP | 6-151744  | 5/1994 |
| JP | 10-242826 | 9/1998 |

* cited by examiner

Primary Examiner—Amir Zarabian
Assistant Examiner—Ida M. Soward
(74) Attorney, Agent, or Firm—Leydig, Voit & Mayer, Ltd.

(57) ABSTRACT

An NMOS transistor circuit has a surge protection circuit connected in parallel with the NMOS transistor. A resistor is connected between a back gate of the NMOS transistor and ground. As a result, an input impedance higher than the input impedance of the surge protection circuit is applied to a semiconductor terminal at the electrode pad side of the NMOS transistor.

17 Claims, 9 Drawing Sheets

SEMICONDUCTOR DEVICE

This disclosure is a continuation-in-part of U.S. patent application Ser. No. 09/871,977, filed Jun. 4, 2001, now U.S. Pat. No. 6,583,475.

FIELD OF THE INVENTION

The present invention relates to a semiconductor device that prevents electrostatic breakdown of a metal oxide semiconductor (MOS) transistor within a semiconductor integrated circuit.

BACKGROUND OF THE INVENTION

Countermeasures against breakdown due to static electricity are important for protecting the high reliability of the semiconductor integrated circuits. On the other hand, it has become practically difficult to achieve this countermeasure against breakdown due to static electricity because of miniaturization and complexity of semiconductor integrated circuits in recent years.

Particularly, generally, the semiconductor integrated circuits include MOS transistors. The input of a CMOS (complementary metal oxide semiconductor) transistor includes a high-impedance electrode and another electrode separated by a thin high-insulation film covering the high-impedance electrode. A capacitor is disadvantageously formed, between these electrodes of the transistor, which may be sometimes electrically charged. If this capacitor is electrically charged, it may momentarily output a high voltage via an electrode pad connected to the transistor.

Similarly, switching operation of mechanical switches or semiconductor switches provided outside of the semiconductor integrated circuit may cause a high voltage to be momentarily applied to the electrode pad connected to the transistor.

When such momentarily generated high voltage is applied to transistors or other external elements as described above, what is called a surge breakdown is generated, like breakdown of these transistors, and a reduction in their life. To avoid this problem, usually a surge protection circuit is disposed between the transistor and the electrode pad of this transistor.

Figure 10:
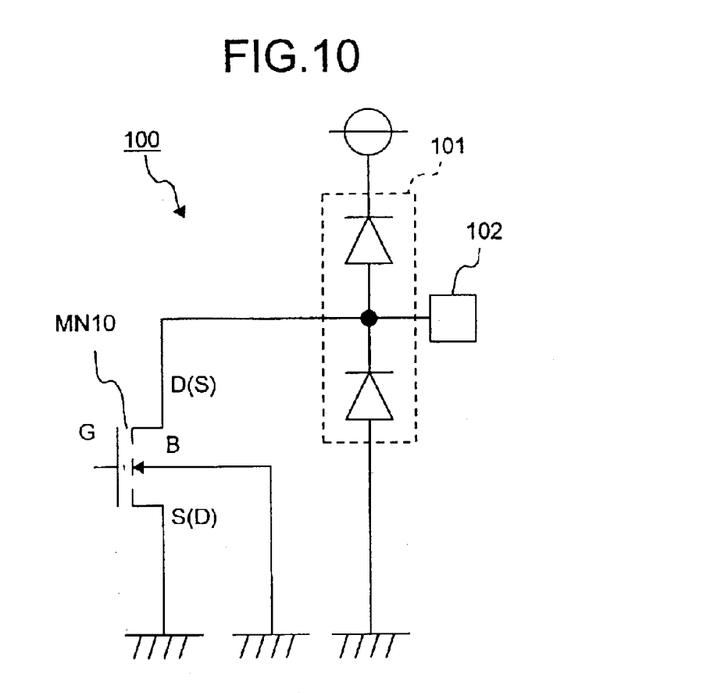
FIG. 10 is a diagram showing an NMOS transistor circuit as one of conventional semiconductor devices.

FIG. 10 is a circuit diagram of NMOS (N-channel metal oxide semiconductor) transistor circuit as an example of a semiconductor device. This transistor circuit 100 includes NMOS transistor MN10 and surge protection circuit 101. The NMOS transistor MN10 has its drain (source) connected to the electrode pad 102, and has its source (drain) and back gate connected to the ground. The surge protection circuit 101 is connected in parallel with the NMOS transistor MN10 relative to the electrode pad 102. Further, the surge protection circuit 101 includes two diodes connected in series. The cathode of one of these diodes is connected to a power source terminal, and the anode of the other diode is connected to the ground. A node of these diodes is connected to the electrode pad 102.

Figure 11:
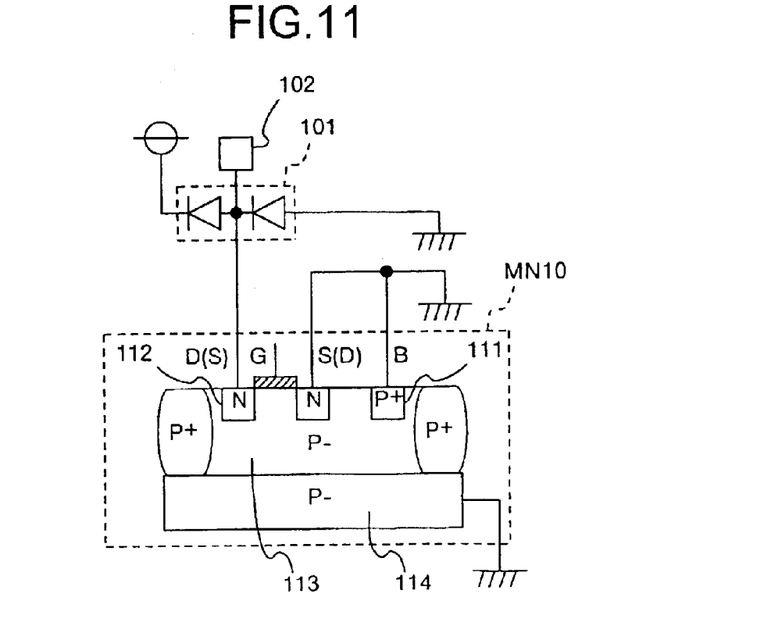
FIG. 11 is a cross-sectional construction diagram for explaining the operation of the NMOS transistor circuit as one of conventional semiconductor devices.

FIG. 11 is a cross-sectional construction diagram for explaining the operation of the NMOS transistor shown in FIG. 10. Consider that surge voltage is applied to the electrode pad 102. As a result, surge current flows into the surge protection circuit 101, and therefore the NMOS transistor MN10 is not destroyed. Thus, surge breakdown of this transistor is prevented.

However, as shown in FIG. 11, when the input impedance of the NMOS transistor MN10 at the electrode pad 102 becomes lower than the input impedance of the surge protection circuit 101 due to the connection of a back gate $P^+$ diffusion layer of the NMOS transistor MN10 to ground, the surge current pierces a junction between a drain (source) N diffusion layer 112 and a $P^-$ well 113. The surge current then passes through a back gate $P^+$ diffusion layer 111 and a $P^-$ substrate 114 to reach the ground. This brings about electrostatic breakdown of the junction surface.

In order to prevent the electrostatic breakdown, conventionally, a transistor of bigger size is used thereby increasing the backward withstand voltage between the drain (source) N diffusion layer 112 and the $P^-$ well 113.

However, there is a problem that, along with the reduction in the sizes of transistors based on reduction in the chip size and the refining of the processes following this trend, the drain (source) diffusion layer has become thinner. As a result, it has become difficult to obtain a sufficient surge withstand voltage.

SUMMARY OF THE INVENTION

It is an object of this invention to provide a semiconductor device capable of preventing the electrostatic breakdown even when the semiconductor device is composed of sufficiently fine MOS transistors.

The semiconductor device according to one aspect of this invention includes a MOS transistor having a source or a drain connected with a wire to an electrode pad; a surge protection circuit connected in parallel with the wire that connects the MOS transistor and the electrode pad; and an impedance adding unit that has input impedance higher than input impedance of the surge protection circuit and that is connected to a back gate of the MOS transistor.

According to the above-mentioned aspect, in a MOS transistor circuit having a surge protection circuit connected in parallel with a MOS transistor, the impedance adding unit is provided at the back gate of the MOS transistor. Therefore, it is possible to apply an input impedance higher than an input impedance of the surge protection circuit to between the back gate of this MOS transistor and the ground (or the power source terminal).

The semiconductor device according to another aspect of this invention includes a plurality of MOS transistors and same number of electrode pads as the MOS transistors, wherein each of the MOS transistor having a source or a drain connected with a wire to corresponding the electrode pad; same number of surge protection circuits as the MOS transistors, wherein each of the surge protection circuit being connected in parallel with the wire that connects corresponding the MOS transistor and the electrode pad; and an impedance adding unit that has input impedance higher than input impedance of each of the surge protection circuit and that is connected in common to back gates of the MOS transistors.

According to the above-mentioned aspect, in a plurality of MOS transistor circuits having a surge protection circuit connected in parallel with each MOS transistor, the impedance adding unit connected in common to the back gate of each MOS transistor is provided. Therefore, one impedance adding unit can apply an input impedance higher than an input impedance of the surge protection circuit to between the back gate of each MOS transistor and the ground (or the power source terminal).

The semiconductor device according to still another aspect of this invention includes a MOS transistor having a source or a drain connected with a wire to an electrode pad; and a surge protection circuit connected in parallel with the wire that connects the MOS transistor and the electrode pad, wherein back gate of the MOS transistor is connected to a point of a semiconductor circuit at which point the impedance is higher than input impedance of the surge protection circuit.

According to the above-mentioned aspect, in a MOS transistor circuit having a surge protection circuit connected in parallel with a MOS transistor, a high impedance point of other semiconductor circuit is connected to a back gate of the MOS transistor. Therefore, it is possible to apply an input impedance higher than an input impedance of the surge protection circuit to between the back gate of this MOS transistor and the ground (or the power source terminal).

Other objects and features of this invention will become apparent from the following description with reference to the accompanying drawings.

DESCRIPTION OF THE PREFERRED EMBODIMENTS

Preferred embodiments of the present invention will be explained in detail below with reference to the accompanying drawings. The present invention is not limited to these embodiments.

Figure 1A:
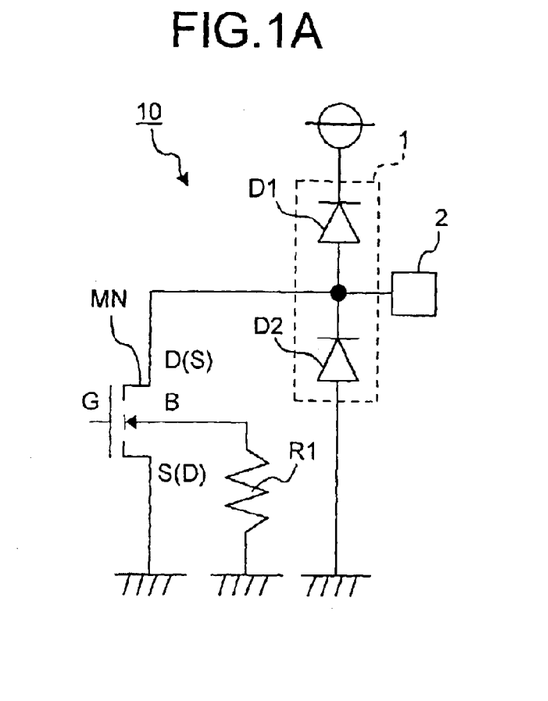
FIG. 1A and FIG. 1B are diagrams showing a CMOS transistor circuit as a semiconductor device relating to a first embodiment of the present invention.
Figure 1B:
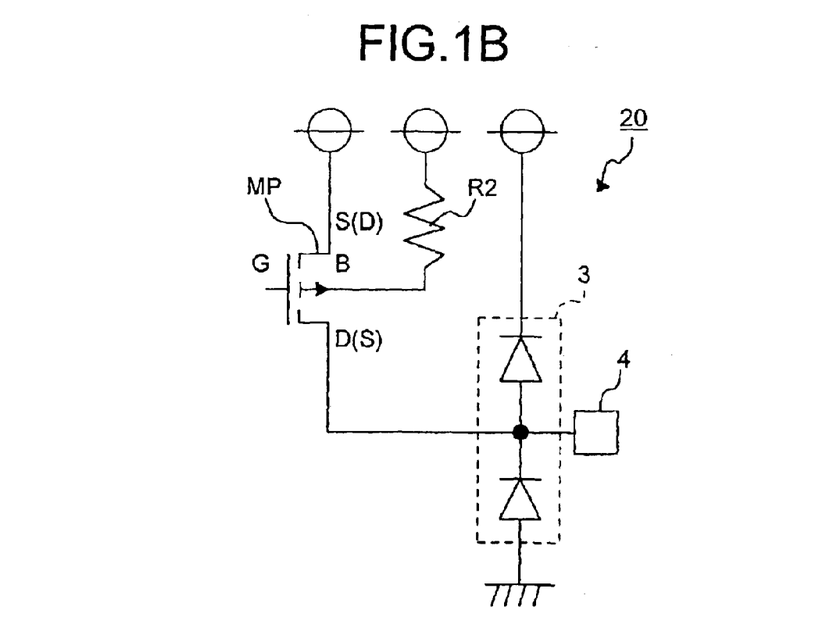

The semiconductor device relating to a first embodiment of the invention will be explained now. FIG. 1A and FIG. 1B are circuit diagrams of CMOS transistor circuit, as an example of semiconductor devices, relating to the first embodiment. Particularly, FIG. 1A shows NMOS transistor circuit and FIG. 1B shows PMOS transistor circuit that make the CMOS transistor circuit.

The NMOS transistor circuit 10 shown in FIG. 1A includes NMOS transistor MN, surge protection circuit 1, and resistor R1. The NMOS transistor MN has its drain (source) connected to the electrode pad 2, has its source (drain) connected to the ground, and has its back gate connected to one terminal of the resistor R1. The surge protection circuit 1 is connected in parallel with the NMOS transistor MN as concerned to the electrode pad 2. As shown in FIG. 1A, the surge protection circuit 1 consists of two diodes D1 and D2 connected in series. Cathode of one diode D1 is connected to a power source terminal, and anode of the other diode D2 is connected to the ground. Node of the diodes D1 and D2 is connected to the electrode pad 2. The other terminal of the resistor R1 is connected to the ground.

The PMOS transistor circuit 20 showing FIG. 1B includes PMOS transistor MP, surge protection circuit 3, and resistor R2. The PMOS transistor MP has its drain (source) connected to an electrode pad 4, has its source (drain) connected to a power source terminal, and has its back gate connected to one terminal of the resistor R2. The surge protection circuit 3 has the same structure as that of the surge protection circuit 1, and the node of the two diodes is connected to the electrode pad 4. The other terminal of the resistor R2 is connected to the power source terminal. The resistors R1 and R2 are polysilicon resistors, diffusion resistors, or wiring resistors such as gate wiring resistors.

Figure 2:
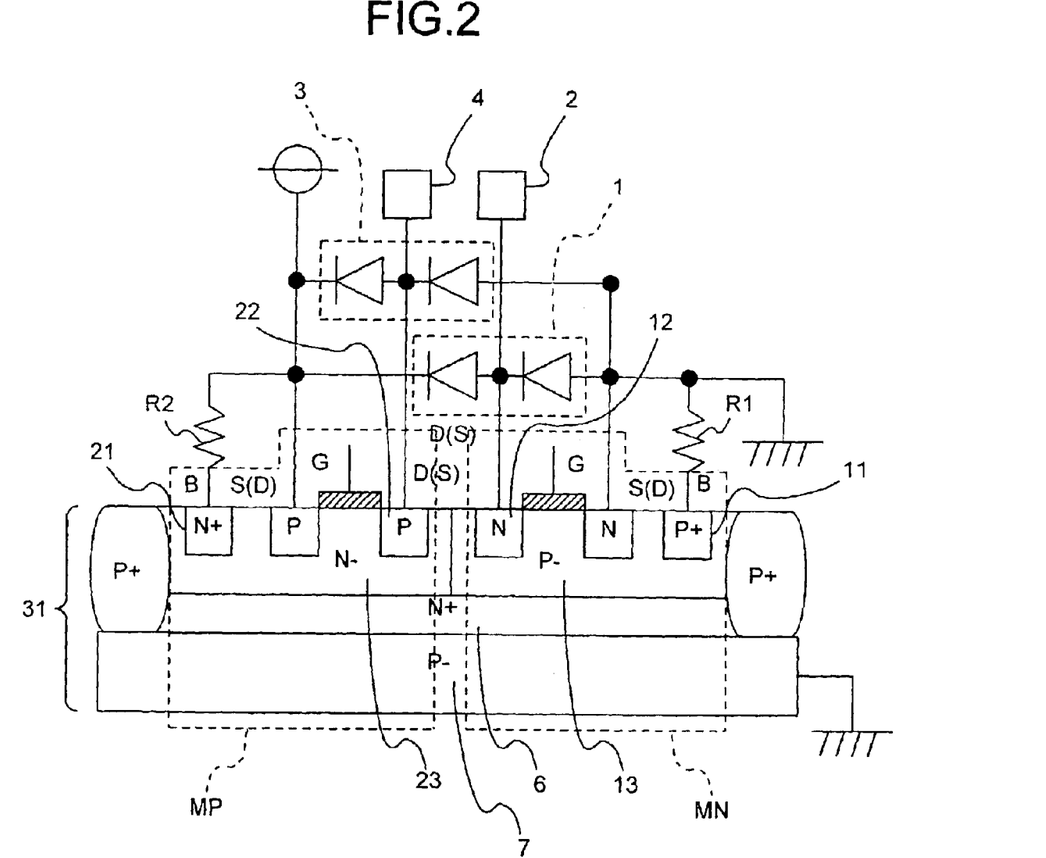
FIG. 2 is a cross-sectional construction diagram of a CMOS transistor circuit for explaining the operation of the semiconductor device relating to the first embodiment.

FIG. 2 is a cross-sectional construction diagram of the CMOS transistor circuit for explaining the operation of the semiconductor device relating to the first embodiment. In FIG. 2, the complementary connected structure of an NMOS transistor MN and a PMOS transistor MP, that is, a CMOS transistor 31, is the same as the conventional structure, and therefore, the explanation of this construction will be omitted here. P$^-$ well 13, N$^-$ well 23, and P$^-$ substrate 7 are separated by N$^+$ floating layer 6, and potential of each back gate of the NMOS transistor MN and PMOS transistor MP can be set optionally.

When a surge voltage is applied to the electrode pad 2, surge current tries to flow to the surface of a junction between a drain (source) N diffusion layer 12 of the NMOS transistor MN and P$^-$ well 13. However, because of the existence of the resistor R1, the impedance of the back gate of the NMOS transistor MN becomes higher than that of the surge protection circuit 1. As a result, the surge current flows to the surge protection circuit 1. Therefore, based on this arrangement, it is possible to prevent the occurrence of the electrostatic breakdown on the surface of the junction.

Similarly, when a surge voltage has been applied to the electrode pad 4, a surge current tries to flow to the surface of a junction between a drain (source) P diffusion layer 22 of the PMOS transistor MP and an N$^-$ well 23. However, because of the existence of the resistor R2, the impedance of the back gate of the PMOS transistor MP becomes higher than that of the surge protection circuit 3. As a result, the surge current flows to the surge protection circuit 3. Therefore, based on this arrangement, it is possible to prevent the occurrence of the electrostatic breakdown on the surface of the junction.

As explained above, according to the semiconductor device relating to the first embodiment, in a MOS transistor circuit having a surge protection circuit connected in parallel with a MOS transistor, a resistor is disposed between the back gate of this MOS transistor and the ground (or the power source terminal). Based on this arrangement, an input impedance higher than that of the surge protection circuit is applied to the semiconductor terminal at the electrode pad side of the MOS transistor. Therefore, it is possible to prevent a surge current from flowing via the back gate of the MOS transistor. As a result, it becomes possible to prevent the MOS transistor from being destroyed and short-lived.

The semiconductor device relating to a second embodiment of the invention will be explained now. The semiconductor device relating to the second embodiment is characterized in that a CMOS transistor different from the CMOS transistor 31 shown in FIG. 2 is provided and that a resistor is connected only between the back gate of the PMOS transistor in the CMOS transistor and the power source terminal.

Figure 3:
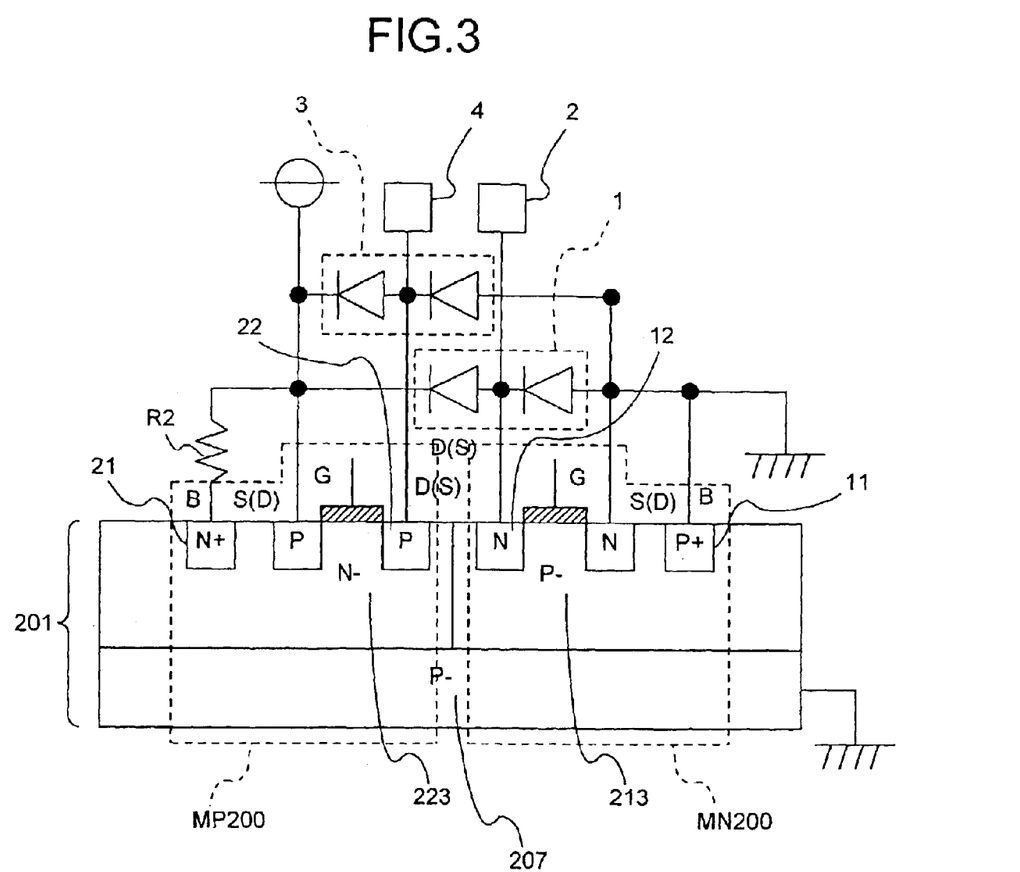
FIG. 3 is a cross-sectional construction diagram of a CMOS transistor circuit for explaining the operation of the semiconductor device relating to the second embodiment.

FIG. 3 is a cross-sectional construction diagram of the CMOS transistor circuit for explaining the operation of the semiconductor device relating to the second embodiment. In FIG. 3, portions common to those in FIG. 2 are provided with like reference numbers, and their explanation will be omitted. In FIG. 3, the complementary connected structure of an NMOS transistor MN200 and a PMOS transistor MP200, that is, a CMOS transistor 201, is provided in place of the CMOS transistor 31 shown in FIG. 2. P⁻ well 213 and N⁻ well 223 are formed over P⁻ substrate 207 connected to the ground, and potential of back gate 21 of the PMOS transistor MP200 can be set optionally. The resistor R2 is polysilicon resistor, diffusion resistor, or wiring resistor such as gate wiring resistor.

When a surge voltage has been applied to the electrode pad 4, a surge current tries to flow to the surface of a junction between a drain (source) P diffusion layer 22 of the PMOS transistor MP200 and an N⁻ well 23. However, because of the existence of the resistor R2, the impedance of the back gate of the PMOS transistor MP200 becomes higher than that of the surge protection circuit 3. As a result, the surge current flows to the surge protection circuit 3. Therefore, based on this arrangement, it is possible to prevent the occurrence of the electrostatic breakdown on the surface of the junction.

As explained above, according to the semiconductor device relating to the second embodiment, in a MOS transistor circuit having a surge protection circuit connected in parallel with a PMOS transistor, a resistor is disposed between the back gate of this PMOS transistor and the power source terminal. Based on this arrangement, an input impedance higher than that of the surge protection circuit is applied to the semiconductor terminal at the electrode pad side of the PMOS transistor. Therefore, it is possible to prevent a surge current from flowing via the back gate of the PMOS transistor. As a result, it becomes possible to prevent the PMOS transistor from being destroyed and short-lived.

The semiconductor device relating to a third embodiment of the invention will be explained now. The semiconductor device relating to the third embodiment is characterized in that a CMOS transistor different from the CMOS transistor 31 shown in FIG. 2 is provided and that a resistor is connected only between the back gate of the NMOS transistor in the CMOS transistor and the ground.

Figure 4:
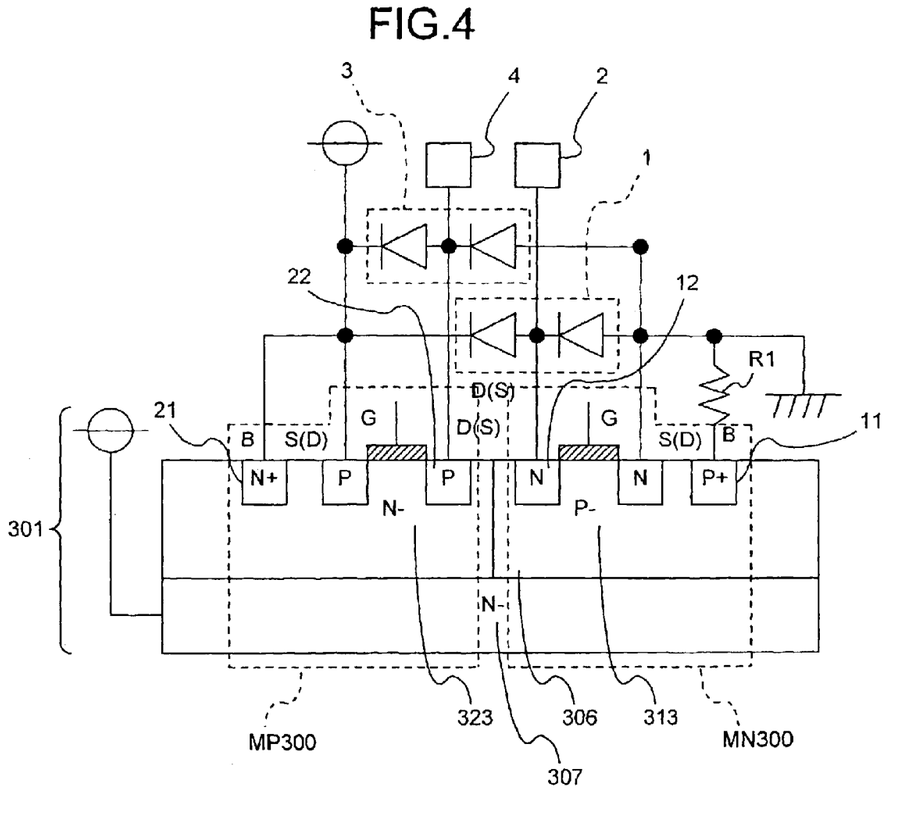
FIG. 4 is a cross-sectional construction diagram of a CMOS transistor circuit for explaining the operation of the semiconductor device relating to the third embodiment.

FIG. 4 is a cross-sectional construction diagram of the CMOS transistor circuit for explaining the operation of the semiconductor device relating to the third embodiment. In FIG. 4, portions common to those in FIG. 2 are provided with like reference numbers, and their explanation will be omitted. In FIG. 4, the complementary connected structure of an NMOS transistor MN300 and a PMOS transistor MP300, that is, a CMOS transistor 301, is provided in place of the CMOS transistor 31 shown in FIG. 2. P⁻ well 313 and N⁻ well 323 are formed over N⁻ substrate 307 connected to the power source terminal, and potential of back gate 11 of the NMOS transistor MN300 can be set optionally. The resistor R1 is polysilicon resistor, diffusion resistor, or wiring resistor such as gate wiring resistor.

When a surge voltage is applied to the electrode pad 2, surge current tries to flow to the surface of a junction between a drain (source) N diffusion layer 12 of the NMOS transistor MN and P⁻ well 213. However, because of the existence of the resistor R1, the impedance of the back gate of the NMOS transistor MN300 becomes higher than that of the surge protection circuit 1. As a result, the surge current flows to the surge protection circuit 1. Therefore, based on this arrangement, it is possible to prevent the occurrence of the electrostatic breakdown on the surface of the junction.

As explained above, according to the semiconductor device relating to the third embodiment, in a MOS transistor circuit having a surge protection circuit connected in parallel with a NMOS transistor, a resistor is disposed between the back gate of this NMOS transistor and the ground. Based on this arrangement, an input impedance higher than that of the surge protection circuit is applied to the semiconductor terminal at the electrode pad side of the NMOS transistor. Therefore, it is possible to prevent a surge current from flowing via the back gate of the NMOS transistor. As a result, it becomes possible to prevent the NMOS transistor from being destroyed and short-lived.

The semiconductor device relating to a fourth embodiment of the invention will be explained now. The semiconductor device relating to the fourth embodiment is characterized in that a CMOS transistor different from the CMOS transistor 31 shown in FIG. 2 is provided.

Figure 5:
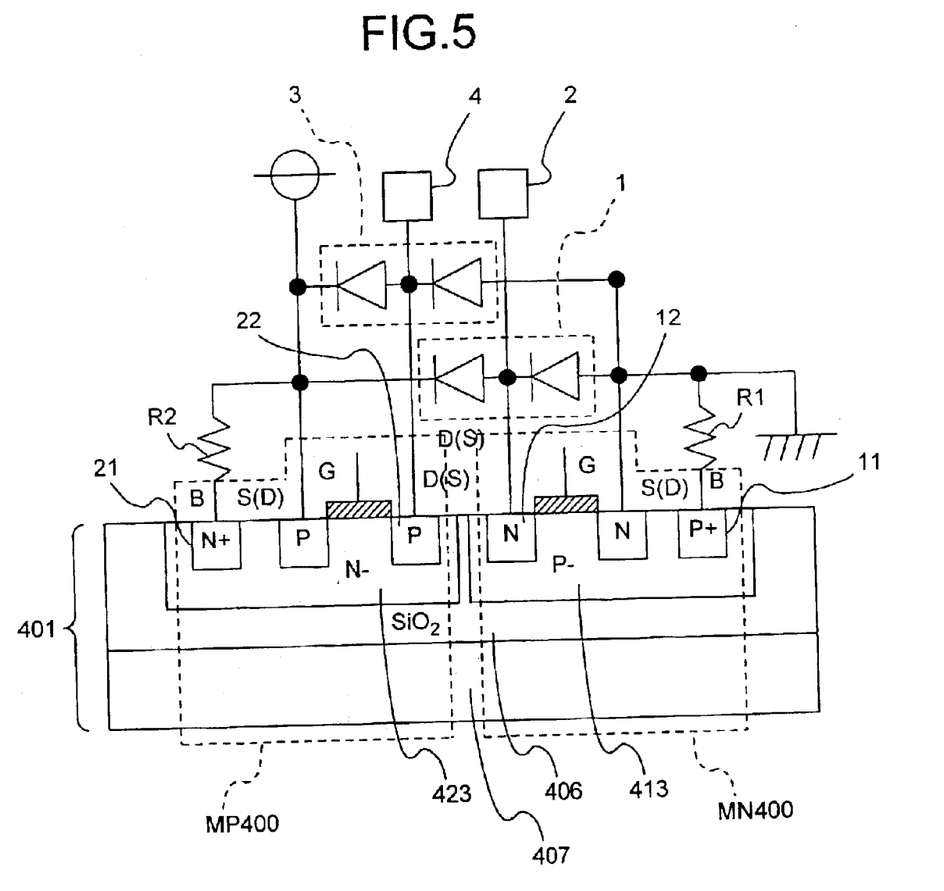
FIG. 5 is a cross-sectional construction diagram of a CMOS transistor circuit for explaining the operation of the semiconductor device relating to the fourth embodiment.

FIG. 5 is a cross-sectional construction diagram of the CMOS transistor circuit for explaining the operation of the semiconductor device relating to the fourth embodiment. In FIG. 5, portions common to those in FIG. 2 are provided with like reference numbers, and their explanation will be omitted. In FIG. 5, the complementary connected structure of an NMOS transistor MN400 and a PMOS transistor MP400, that is, a CMOS transistor 401, is provided in place of the CMOS transistor 31 shown in FIG. 2. P⁻ well 413, N⁻ well 423, and substrate 407 are separated by silica insulating layer 406, and potential of back gate of the NMOS transistor MN400 can be set optionally. The resistors R1 and R2 are polysilicon resistors, diffusion resistors, or wiring resistors such as gate wiring resistors.

When a surge voltage is applied to the electrode pad 2, surge current tries to flow to the surface of a junction between a drain (source) N diffusion layer 12 of the NMOS transistor MN and P⁻ well 13. However, because of the existence of the resistor R1, the impedance of the back gate of the NMOS transistor MN becomes higher than that of the surge protection circuit 1. As a result, the surge current flows to the surge protection circuit 1. Therefore, based on this arrangement, it is possible to prevent the occurrence of the electrostatic breakdown on the surface of the junction.

Similarly, when a surge voltage has been applied to the electrode pad 4, a surge current tries to flow to the surface of a junction between a drain (source) P diffusion layer 22 of the PMOS transistor MP400 and an N⁻ well 23. However, because of the existence of the resistor R2, the impedance of the back gate of the PMOS transistor MP400 becomes higher than that of the surge protection circuit 3. As a result, the surge current flows to the surge protection circuit 3. Therefore, based on this arrangement, it is possible to prevent the occurrence of the electrostatic breakdown on the surface of the junction.

As explained above, according to the semiconductor device relating to the fourth embodiment, in a MOS transistor circuit having a surge protection circuit connected in parallel with a MOS transistor, a resistor is disposed between the back gate of this MOS transistor and the ground (or the power source terminal). Based on this arrangement, an input impedance higher than that of the surge protection circuit is applied to the semiconductor terminal at the electrode pad side of the MOS transistor. Therefore, it is possible to prevent a surge current from flowing via the back gate of the MOS transistor. As a result, it becomes possible to prevent the MOS transistor from being destroyed and short-lived.

The semiconductor device relating to a fifth embodiment of the invention will be explained now. The semiconductor device relating to the fifth embodiment is characterized in that a high-impedance circuit is provided in place of the resistor R1 shown in FIG. 1A.

Figure 6:
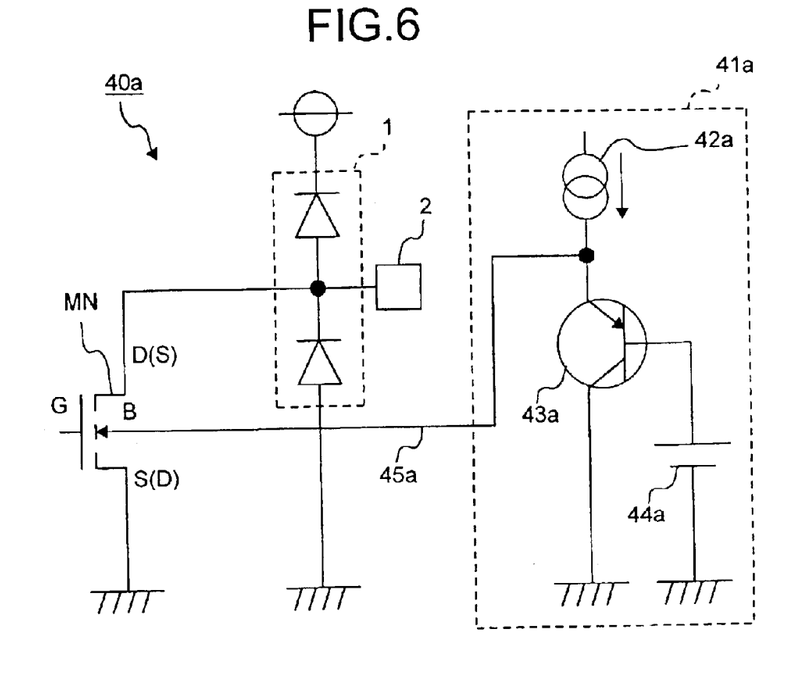
FIG. 6 is a diagram showing an NMOS transistor circuit as a semiconductor device relating to a fifth embodiment of the present invention.

FIG. 6 is a circuit diagram of NMOS transistor circuit, as an example of semiconductor devices, relating to the fifth embodiment. In FIG. 6, portions common to those in FIG. 1A are provided with like reference numbers, and their explanation will be omitted. In the NMOS transistor circuit 40a shown in FIG. 6, high-impedance circuit 41a is connected to back gate of the NMOS transistor MN.

The high-impedance circuit 41a includes the pnp transistor 43a having its emitter connected to the constant-current source 42a, having its base connected to the constant-voltage source 44a, and having its collector connected to the ground. Particularly, in this high-impedance circuit 41a, the emitter of the pnp transistor 43a is connected to a back gate of the NMOS transistor MN. In other words, the impedance of the emitter resistor of the pnp transistor determined by a constant current supplied from the constant-current source 42a and a constant voltage applied by the constant-voltage source 44a exists between the back gate of the NMOS transistor MN and the ground.

Figure 7:
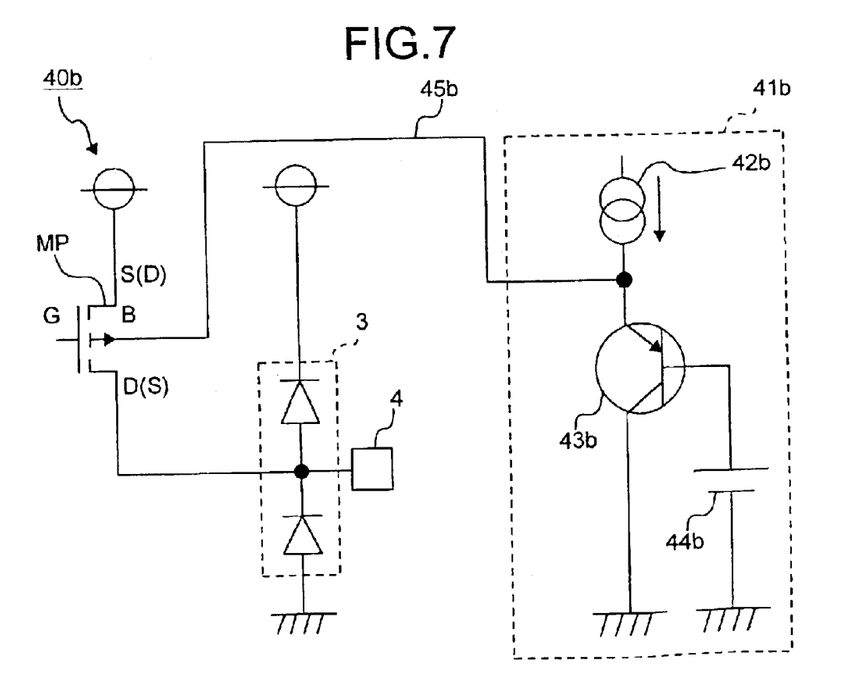
FIG. 7 is a diagram showing a PMOS transistor circuit as a semiconductor device relating to the fifth embodiment of the present invention.

FIG. 7 is a circuit diagram of PMOS transistor circuit, as an example of semiconductor devices, relating to the fifth embodiment. In FIG. 7, portions common to those in FIG. 1B are provided with like reference numbers, and their explanation will be omitted. In the PMOS transistor circuit 40b shown in FIG. 7, high-impedance circuit 41b is connected to back gate of the PMOS transistor MP. In FIG. 7, moreover, reference numbers 41b, 42b, 43b, and 44b correspond to the high-impedance circuit 41a, the constant-current source 42a, the pnp transistor 43a, and the constant-voltage source 44a respectively as shown in FIG. 6.

As explained above, according to the semiconductor device relating to the fifth embodiment, in a MOS transistor circuit having a surge protection circuit connected in parallel with a MOS transistor, a high-impedance circuit is disposed between the back gate of this MOS transistor and the ground (or the power source terminal). Based on this arrangement, an input impedance higher than that of the surge protection circuit is applied to the semiconductor terminal at the electrode pad side of the MOS transistor. Therefore, it is possible to obtain the effects similar to those of the first embodiment. Particularly, the employment of this high-impedance circuit is effective when there is no space for building a polysilicon resistor, a diffusion resistor, or wiring resistor such as gate wiring resistor on the chip.

The above high-impedance circuit may be any circuit that has a portion of impedance higher than that of the surge protection circuit. Particularly, when there exists a high-impedance portion in other circuit on the same chip on which the MOS transistor is formed, it is possible to draw this high-impedance portion to the back gate of the MOS transistor as a high-impedance line. In the second and fourth embodiments, for example, the back gate of the PMOS transistor may connect to the high-impedance line 45b shown in FIG. 7 in place of the resistor R2. In the third and fourth embodiments, for example, the back gate of the NMOS transistor may connect to the high-impedance line 45a shown in FIG. 6 in place of the resistor R1.

The semiconductor device relating to a sixth embodiment of the invention will be explained now. The semiconductor device relating to the third embodiment is characterized in that the semiconductor device has a resistor connected in common to back gates of respective MOS transistors of a plurality of MOS transistor circuits.

Figure 8:
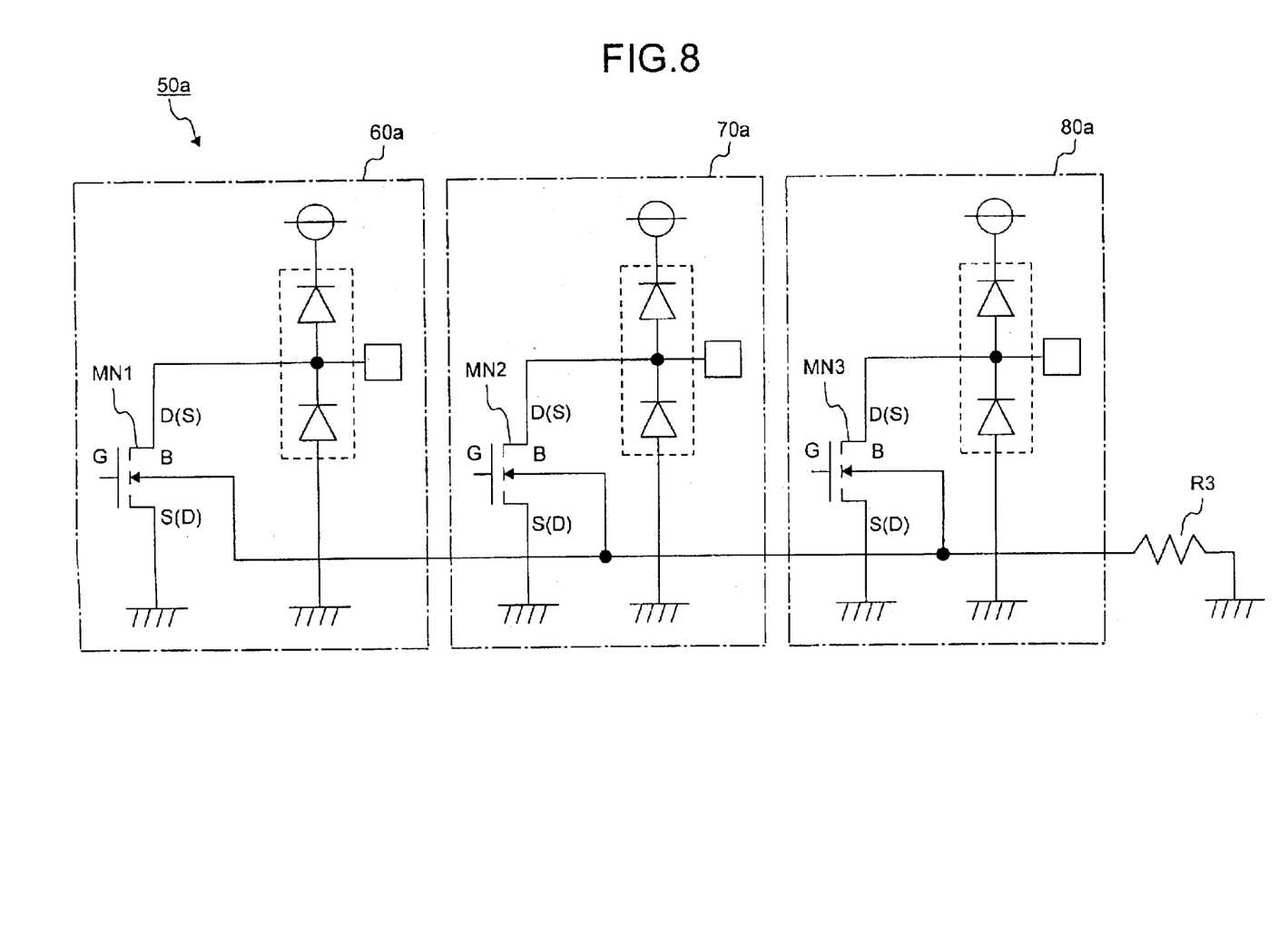
FIG. 8 is a diagram showing an NMOS transistor circuit as a semiconductor device relating to a sixth embodiment of the present invention.

FIG. 8 is a circuit diagram of NMOS transistor circuit, as an example of the semiconductor devices, relating to the sixth embodiment. In the NMOS transistor 50a shown in FIG. 8, one terminal of the resistor R3 is connected in common to back gates of respective NMOS transistors MN1, MN2 and MN3 of three NMOS transistor circuits 60a, 70a and 80a. The other terminal of the resistor R3 is connected to the ground. The structure of each of the NMOS transistors 60a, 70a and 80a is the same as the conventional structure. The resistor R3 is polysilicon resistor, diffusion resistor, or wiring resistor such as gate wiring resistor.

Figure 9:
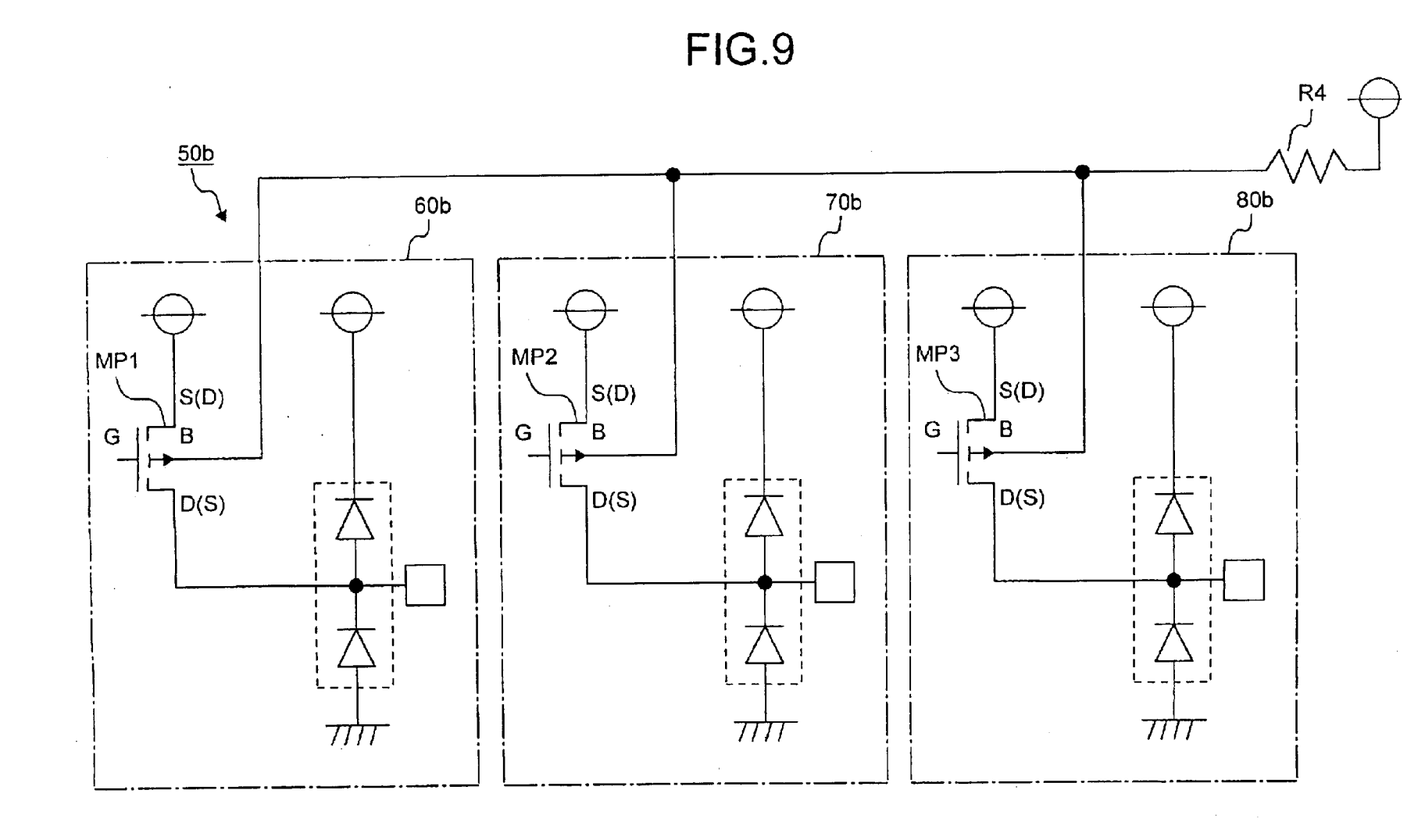
FIG. 9 is a diagram showing a PMOS transistor circuit as a semiconductor device relating to the sixth embodiment of the present invention.

The back gate of the NMOS transistor in each CMOS transistor in the first, third, and fourth embodiments, for example, may connect to the common resistor R3 shown in FIG. 9 in place of the resistor R1.

FIG. 9 is a circuit diagram of PMOS transistor circuit, as an example of the semiconductor devices, relating to the sixth embodiment. In the PMOS transistor 50b shown in FIG. 9, one terminal of the resistor R4 is connected in common to back gates of respective PMOS transistors MP1, MP2 and MP3 of three PMOS transistor circuits 60b, 70b and 80b. The other terminal of the resistor R4 is connected to the power source terminal. The structure of each of the PMOS transistors 60b, 70b and 80b is the same as the conventional structure. The resistor R4 is polysilicon resistor, diffusion resistor, or wiring resistor such as gate wiring resistor.

The back gate of the PMOS transistor in each CMOS transistor in the first, second, and fourth embodiments, for example, may connect to the common resistor R4 shown in FIG. 9 in place of the resistor R2.

As explained above, according to the semiconductor device relating to the sixth embodiment, a resistor is used in common for the back gates of MOS transistors of a plurality of MOS transistor circuits. Therefore, it is possible to obtain the effects similar to those of the first embodiment. Further, as it is not necessary to provide a resistor to be connected to the back gate of each MOS transistor circuit, this structure is effective when there is no space for building a polysilicon resistor, a diffusion resistor, or wiring resistor such as gate wiring resistor corresponding to the plurality of transistors on the chip.

In the first to sixth embodiments, a MOS transistor circuit that is connected to the source (drain) of the MOS transistor, or that is connected directly to the ground, or that is connected to the power source terminal is explained. However, structure is not particularly limited to this. It is sufficient when the resistor or the high-impedance circuit is connected to the back gate of the MOS transistor as described above.

As explained above, according to the present invention, in a MOS transistor circuit having a surge protection circuit connected in parallel with a MOS transistor, impedance adding unit is provided at the back gate of the MOS transistor. Therefore, it is possible to apply an input impedance higher than an input impedance of the surge protection circuit to between the back gate of this MOS transistor and the ground (or the power source terminal). As a result, there is an effect that it is possible to prevent a surge current from flowing via the back gate of the MOS transistor, and it becomes possible to prevent the MOS transistor from being destroyed and short-lived.

Furthermore, in a plurality of MOS transistor circuits having a surge protection circuit connected in parallel with each MOS transistor, impedance adding unit connected in common to the back gate of each MOS transistor is provided. Therefore, one impedance adding unit can apply an input impedance higher than an input impedance of the surge protection circuit to between the back gate of each MOS transistor and the ground (or the power source terminal). As a result, there is an effect that it is possible to prevent a surge current from flowing via the back gate of the MOS transistor, and it becomes possible to prevent the MOS transistor from being destroyed and short-lived. Further, it is possible to minimize the increase in the area due to the addition of the impedance adding unit.

Furthermore, in a MOS transistor circuit having a surge protection circuit connected in parallel with a MOS transistor, there is an effect that it is possible to utilize a resistor formed by a semiconductor layer like a polysilicon resistor, a diffusion resistor, or wiring resistor as the impedance adding unit that is disposed between the back gate of the MOS transistor and the ground (or the power source terminal).

Furthermore, in a MOS transistor circuit having a surge protection circuit connected in parallel with a MOS transistor, it is possible to utilize a wiring resistor formed by wiring as the impedance adding unit that is disposed between the back gate of the MOS transistor and the ground (or the power source terminal). Therefore, there is an effect that it is possible to apply a high impedance to the back gate when there is no space for building a resistor formed by a semiconductor on the chip.

Furthermore, in a MOS transistor circuit having a surge protection circuit connected in parallel with a MOS transistor, a high impedance point of other semiconductor circuit is connected to a back gate of the MOS transistor. Therefore, it is possible to apply an input impedance higher than an input impedance of the surge protection circuit to between the back gate of this MOS transistor and the ground (or the power source terminal). As a result, there is an effect that it is possible to prevent a surge current from flowing via the back gate of the MOS transistor, and it becomes possible to prevent the MOS transistor from being destroyed and short-lived. Further, it is not necessary to provide a special circuit for applying this high impedance.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a p-type semiconductor substrate;
   an n-type semiconductor layer and a p-type semiconductor layer, on the p-type semiconductor substrate;
   at least one NMOS transistor including, in the p-type semiconductor layer, an n-type drain region and a p-type back gate region;
   a first surge protection circuit;
   a first electrode pad to which the n-type drain region and the first surge protection circuit are connected;
   at least one PMOS transistor including, in the n-type semiconductor layer, a p-type drain region and an n-type back gate region;
   a second surge protection circuit having a first input impedance;
   a second electrode pad to which the p-type drain region and the second surge protection circuit are connected; and
   an impedance adding unit having a second input impedance, higher than the first input impedance, adding the second input impedance to the n-type back gate region.

2. The semiconductor device according to claim 1, wherein
   the first surge protection circuit includes first and second diodes, each of the first and second diodes having a cathode and an anode,
   the cathode of the first diode is connected to a power source terminal,
   the anode of the first diode is connected to the cathode of the second diode,
   the anode of the second diode is connected to ground, and
   the first and second diodes are connected together at a node connected to the first electrode pad and to the n-type drain region.

3. The semiconductor device according to claim 1, wherein
   the second surge protection circuit includes first and second diodes, each of the first and second diodes having a cathode and an anode,
   the cathode of the first diode is connected to a power source terminal,
   the anode of the first diode is connected to the cathode of the second diode,
   the anode of the second diode is connected to ground, and
   the first and second diodes are connected together at a node connected to the second electrode pad and to the p-type drain region.

4. The semiconductor device according to claim 1, wherein the impedance adding unit includes a resistor in a semiconductor layer.

5. The semiconductor device according to claim 1, including a plurality of the PMOS transistors, wherein the impedance adding unit is commonly connected to the respective n-type back gate regions of the respective PMOS transistors.

6. A semiconductor device comprising:
   an n-type semiconductor substrate;
   an n-type semiconductor layer and a p-type semiconductor layer, on the n-type semiconductor substrate;
   at least one NMOS transistor including, in the p-type semiconductor layer, an n-type drain region and a p-type back gate region;
   a first surge protection circuit having a first input impedance;
   a first electrode pad to which the n-type drain region and the first surge protection circuit are connected;
   at least one PMOS transistor including, in the n-type semiconductor layer, a p-type drain region and an n-type back gate region;
   a second surge protection circuit;

a second electrode pad to which the p-type drain region and the second surge protection circuit are connected; and an impedance adding unit having a second input impedance, higher than the first input impedance, adding the second input impedance to the p-type back gate region.

7. The semiconductor device according to claim 6, wherein the first surge protection circuit includes first and second diodes, each of the first and second diodes having a cathode and an anode, the cathode of the first diode is connected to a power source terminal, the anode of the first diode is connected to the cathode of the second diode, the anode of the second diode is connected to ground, and the first and second diodes are connected together at a node connected to the first electrode pad and to the n-type drain region.

8. The semiconductor device according to claim 6, wherein the second surge protection circuit includes first and second diodes, each of the first and second diodes having a cathode and an anode, the cathode of the first diode is connected to a power source terminal, the anode of the first diode is connected to the cathode of the second diode, the anode of the second diode is connected to ground, and the first and second diodes are connected together at a node connected to the second electrode pad and to the p-type drain region.

9. The semiconductor device according to claim 6, wherein the impedance adding unit includes a resistor in a semiconductor layer.

10. The semiconductor device according to claim 6, including a plurality of the NMOS transistors, wherein the impedance adding unit is commonly connected to the respective p-type back gate regions of the respective NMOS transistors.

11. A semiconductor device comprising:

a semiconductor substrate;

a silica insulating layer on the semiconductor substrate;

a n-type semiconductor layer and a p-type semiconductor layer, on the silica insulating layer;

at least one NMOS transistor including, in the p-type semiconductor layer, an n-type drain region and a p-type back gate region;

a first surge protection circuit having a first input impedance;

a first electrode pad to which the n-type drain region and the first surge protection circuit are connected;

a first impedance adding unit having a second input impedance, higher than the first input impedance, adding the second input impedance to the p-type back gate region;

at least one PMOS transistor including, in the n-type semiconductor layer, a p-type drain region and an n-type back gate region;

a second surge protection circuit having a third input impedance;

a second electrode pad to which the p-type drain region and the second surge protection circuit are connected; and a second impedance adding unit having a fourth input impedance, higher than the third input impedance, the fourth input impedance to the n-type back gate region.

12. The semiconductor device according to claim 11, wherein the first surge protection circuit includes first and second diodes, each of the first and second diodes having a cathode and an anode, the cathode of the first diode is connected to a power source terminal, the anode of the first diode is connected to the cathode of the second diode, the anode of the second diode is connected to ground, and the first and second diodes are connected together at a node connected to the first electrode pad and to the n-type drain region.

13. The semiconductor device according to claim 11, wherein the second surge protection circuit includes first and second diodes, each of the first and second diodes having a cathode and an anode, the cathode of the first diode is connected to a power source terminal, the anode of the first diode is connected to the cathode of the second diode, the anode of the second diode is connected to ground, and the first and second diodes are connected together at a node connected to the second electrode pad and to the p-type drain region.

14. The semiconductor device according to claim 11, wherein the first impedance adding unit includes a resistor in a semiconductor layer.

15. The semiconductor device according to claim 11, wherein the second impedance adding unit includes a resistor in a semiconductor layer.

16. The semiconductor device according to claim 11, including a plurality of the NMOS transistors, wherein the first impedance adding unit is commonly connected to the respective p-type back gate regions of the respective NMOS transistors.

17. The semiconductor device according to claim 11, including a plurality of the PMOS transistors, wherein the second impedance adding unit is commonly connected to the respective n-type back gate regions of the respective PMOS transistors.

* * * * *